(12) United States Patent
Gu et al.

(10) Patent No.: US 10,204,676 B2
(45) Date of Patent: Feb. 12, 2019

(54) DOUBLE DATA RATE SYNCHRONOUS DYNAMIC RANDOM ACCESS MEMORY AND OUTPUT DRIVING CIRCUIT THEREOF

(71) Applicant: REALTEK SEMICONDUCTOR CORP., Hsinchu (TW)

(72) Inventors: Li-Jun Gu, Jiangsu (CN); Ger-Chih Chou, San Jose, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/695,830

(22) Filed: Sep. 5, 2017

(65) Prior Publication Data

US 2018/0277196 A1    Sep. 27, 2018

(30) Foreign Application Priority Data

Mar. 24, 2017   (CN) .......................... 2017 1 0181867

(51) Int. Cl.
*G11C 11/4096*   (2006.01)
*G11C 7/10*   (2006.01)

(52) U.S. Cl.
CPC ........ *G11C 11/4096* (2013.01); *G11C 7/1051* (2013.01); *G11C 7/1066* (2013.01); *G11C 7/1072* (2013.01); *G11C 7/1093* (2013.01)

(58) Field of Classification Search
CPC ................................................. G11C 11/4096
See application file for complete search history.

(56) References Cited

U.S. PATENT DOCUMENTS

| | | | |
|---|---|---|---|
| 6,018,450 A | 1/2000 | Ahmad et al. | |
| 6,618,457 B1 | 9/2003 | Yi et al. | |
| 8,994,412 B2 | 3/2015 | Kim | |
| 2010/0164544 A1* | 7/2010 | Song ............. | H03K 19/018521 326/80 |
| 2013/0278296 A1* | 10/2013 | Amirkhany ...... | H03K 19/00315 327/108 |

* cited by examiner

*Primary Examiner* — Hoai V Ho
*Assistant Examiner* — Jay Radke
(74) *Attorney, Agent, or Firm* — Li & Cai Intellectual Property (USA) Office (57) ABSTRACT

A double data rate synchronous dynamic random access memory includes a control circuit and an output driving circuit. The control circuit provides a first voltage, a second voltage, a third voltage and a fourth voltage. The output driving circuit couples to the control circuit and includes a pull-up circuit, a pad and a pull-down circuit. When a voltage of the pad rises from the fourth voltage to the first voltage, a voltage between a drain and a source of a second driving transistor in the pull-down circuit is between the third voltage and the fourth voltage. When a voltage of the pad falls from the first voltage to the fourth voltage, a voltage between a drain and a source of a first driving transistor in the pull-up circuit is between the first voltage and the second voltage.

20 Claims, 6 Drawing Sheets

DOUBLE DATA RATE SYNCHRONOUS DYNAMIC RANDOM ACCESS MEMORY AND OUTPUT DRIVING CIRCUIT THEREOF

BACKGROUND OF THE INVENTION

1. Field of the Invention

The instant disclosure relates to an output driving circuit of a memory, and, more particularly, to an output driving circuit of a high speed access memory.

2. Description of Related Art

Currently the input/output (I/O) voltages of double data rate synchronous dynamic random access memories (DDR SDRAM) DDR3, DDR3L, DDR4, and DDR4L are 1.5, 1.35, 1.2, and 1.1 volts, respectively, where a maximum access speed of the DDR3 and DDR3L is 2133 Mbps, and a maximum access speed of the DDR4 and DDR4L is 3200 Mbps.

Conventionally, input/output withstanding high voltage are used in DDR3 to be compatible with high input/output voltages, but input/output withstanding high voltage causes a slower speed. With the popularity of DDR4 and the arrival of higher-speed DDR, an important issue in the art is to provide an output driving circuit of DDR SDRAM that can be compatible with different input/output voltages.

SUMMARY OF THE INVENTION

In order to solve the above-mentioned problems, an embodiment of the instant disclosure provides a double data rate synchronous dynamic random access memory. The double data rate synchronous dynamic random access memory includes a control circuit and an output driving circuit. The control circuit provides a first voltage, a second voltage, a third voltage and a fourth voltage. The output driving circuit is coupled to the control circuit. The output driving circuit includes a pull-up circuit, a pull-down circuit and a pad. The pull-up circuit includes a first driving transistor, a first cascode transistor and a first resistor. A source terminal of the first driving transistor receives the first voltage, and a gate terminal of the first driving transistor receives the first voltage or the second voltage. A source terminal of the first cascode transistor is connected to a drain terminal of the first driving transistor, and a gate terminal of the first cascode transistor receives the second voltage. A first end of the first resistor is connected to a drain terminal of the first cascode transistor. The pad is connected to a second end of the first resistor. The pull-down circuit includes a second resistor, a second cascode transistor and a second driving transistor. A first end of the second resistor is connected to the pad. A drain terminal of the second cascode transistor is connected to a second end of the second resistor, and a gate terminal of the second cascode transistor receives the third voltage. A drain terminal of the second driving transistor is connected to a source terminal of the second cascode transistor, a gate terminal of the second driving transistor receives the third voltage or the fourth voltage, and a source terminal of the second driving transistor receives the fourth voltage. The second voltage is between the third voltage and the fourth voltage, and the third voltage is smaller than the first voltage.

An embodiment of the instant disclosure provides an output driving circuit that includes a pull-up circuit, a pad, and a pull-down circuit. The pull-up circuit includes a first driving transistor, a first cascode transistor and a first resistor. A source terminal of the first driving transistor receives the first voltage, and a gate terminal of the first driving transistor receives the first voltage or the second voltage. A source terminal of the first cascode transistor is connected to a drain terminal of the first driving transistor, and a gate terminal of the first cascode transistor receives the second voltage. A first end of the first resistor is connected to a drain terminal of the first cascode transistor. The pad is connected to a second end of the first resistor. The pull-down circuit includes a second resistor, a second cascode transistor and a second driving transistor. A first end of the second resistor is connected to the pad. A drain terminal of the second cascode transistor is connected to a second end of the second resistor, and a gate terminal of the second cascode transistor receives the third voltage. A drain terminal of the second driving transistor is connected to a source terminal of the second cascode transistor, a gate terminal of the second driving transistor receives the third voltage or the fourth voltage, and a source terminal of the second driving transistor receives the fourth voltage. The second voltage is between the third voltage and the fourth voltage, and the third voltage is smaller than the first voltage.

The memory and the output driving circuit of the instant disclosure can ensure that the transistor within the output driving circuit does not have the overvoltage problems, and that the output driving circuit meets the needs of high-speed access and be compatible with DDR3, DDR3L, DDR4, LPDDR4, and even higher-speed DDR.

DETAILED DESCRIPTION OF PREFERRED EMBODIMENTS

Figure 1:
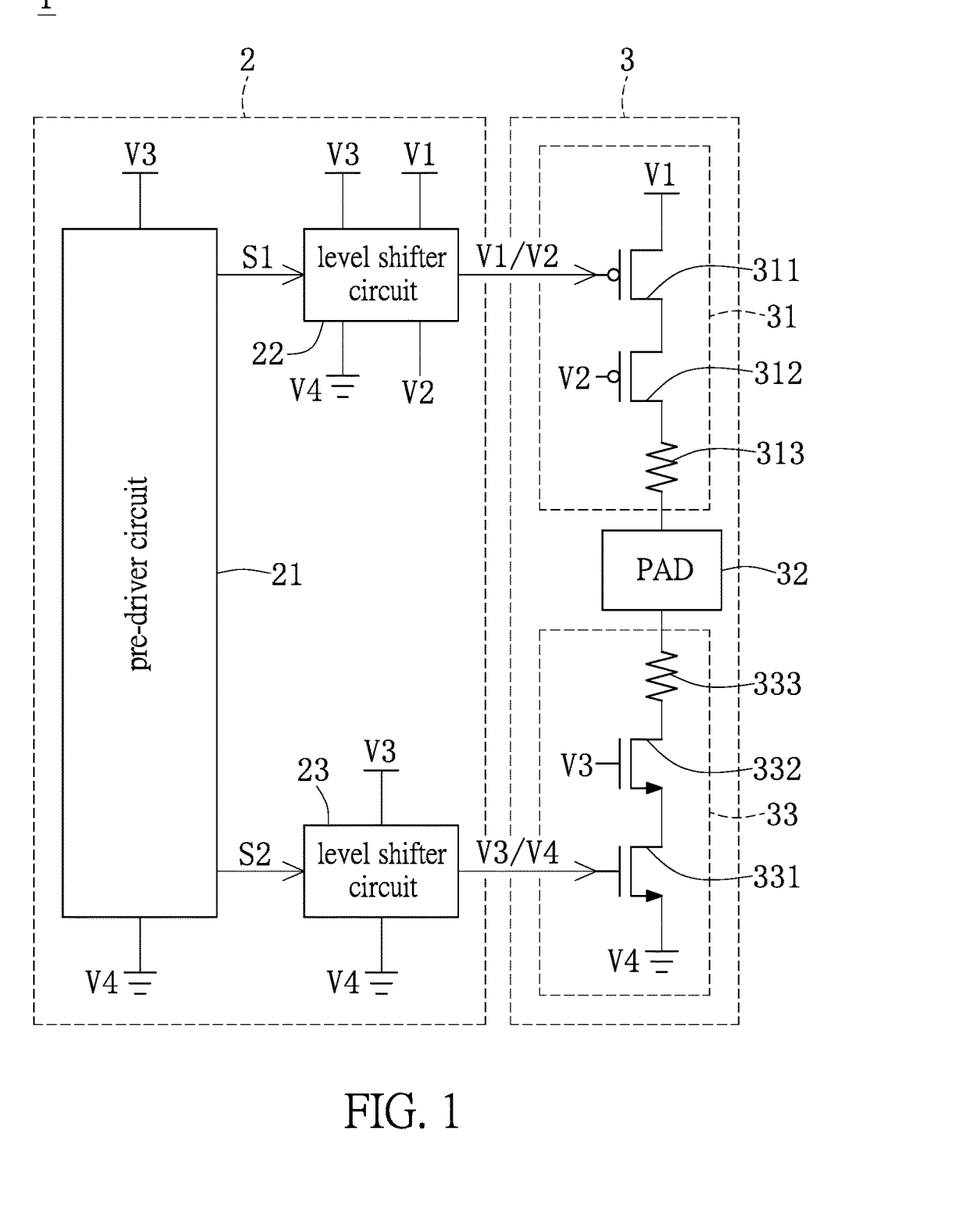
FIG. 1 shows a diagram of a memory depicted in accordance with an embodiment of the instant disclosure.

Reference is made to FIG. 1. FIG. 1 shows a diagram of a memory 1 depicted in accordance with an embodiment of the instant disclosure. The memory 1 includes a control circuit 2 and an output driving circuit 3. The control circuit includes a pre-driving circuit 21, and level shifter circuits 22 and 23. An external power supply provides a work voltage, i.e., a voltage V3, to the pre-driving circuit 21 and the level shifter circuits 22 and 23. The pre-driving circuit 21 provides pre-driver signals S1 and S2 to the level shifter circuits 22 and 23 respectively. The level shifter circuit 22 receives the pre-driver signal S1 so as to transform the pre-driver signal S1 to voltages V1 and V2, and provides the voltages V1 and V2 to the output driving circuit 3. The level shifter circuit 23 receives the pre-driver signal S2 so as to transform the pre-driver signal S2 to voltages V3 and V4 and provide the voltages V3 and V4 to the output driving circuit 3.

[T]he voltage V3 is a power voltage which is an operating voltage for elements in the output driving circuit 3 to work, such as 1V (volts). The voltage V4 may be, for example, 0V.

The voltage V1 is larger than the voltage V3. The voltage V1 could be an input/output voltage of the output driving circuit 3, such as 1.5V, 1.35V, 1.2V, or 1.1V. The voltage V2 is between the voltage V3 and the voltage V4. In some embodiments, the voltage V2 is equal to the result of subtracting a voltage value of the voltage V3 from that of the voltage V1.

The output driving circuit 3 includes a pull-up circuit 31, a pad 32 and a pull-down circuit 33. The pull-up circuit 31 includes a driving transistor 311, a cascode transistor 312 and a resistor 313. A source terminal of the driving transistor 311 receives the voltage V1. A gate terminal of the driving transistor 311 receives the voltage V1 or the voltage V2. A source terminal of the cascode transistor 312 connects to a drain terminal of the driving transistor 311. A gate terminal of the cascode transistor receives the voltage V2. A first end of the resistor 313 connects to a drain terminal of the cascode transistor 312. The pad 32 connects to a second end of the resistor 313. The pull-down circuit 33 includes a driving transistor 331, a cascode transistor 332 and a resistor 333. A first end of the resistor 333 connects to the pad 32. A drain terminal of the cascode transistor 332 connects to a second end of the resistor 333. A gate terminal of the cascode transistor 332 receives the voltage V3. A drain terminal of the driving transistor 331 connects to a source terminal of the cascode transistor 332. A gate terminal of the driving transistor 331 receives the voltage V3 or the voltage V4. A source terminal of the driving transistor 331 receives the voltage V4.

In this embodiment, if a voltage of the pad 32 rises from the voltage V4 to the voltage V1, the gate terminal of the driving transistor 311 receives the voltage V2 and the gate terminal of the driving transistor 331 receives the voltage V4. The driving transistor 311 and the cascode transistor 312 are turned on. There are no voltage differences between the source and the drain terminals of the driving transistor 311 and between the source and the drain terminals of the cascode transistor 312. As a voltage of the drain terminal of the cascode transistor 332 rises, the source terminal of the cascode transistor 332 is not affected by a rising voltage since the gate terminal of the cascode transistor 332 receives the voltage V3 (fixed voltage). Then, a voltage of the source terminal of the cascode transistor 332 does not rise over the voltage V3 so that a voltage between the drain and the source terminals of the driving transistor 331 is between the voltage V3 and the voltage V4.

In this embodiment, when a voltage of the pad 32 falls from the voltage V1 to the voltage V4, the gate terminal of the driving transistor 311 receives the voltage V1 and the gate terminal of the driving transistor 331 receives the voltage V3. The driving transistor 331 and the cascode transistor 332 are turned on. There are no voltage differences between the source terminal and the drain terminal of the driving transistor 331 and between the source terminal and the drain terminal of the cascode transistor 332. As a voltage of the drain terminal of the cascode transistor 312 falls, the source of the cascode transistor 312 is not affected by a falling voltage since the gate terminal of the cascode transistor 312 receives voltage V2 (fixed voltage). Then, a voltage of the source terminal of the cascode transistor 312 does not rise over the voltage V2 so that a voltage between the drain and the source terminals of the driving transistor 311 is between the voltage V1 and the voltage V2.

With this embodiment, the instant disclosure can ensure that there is no overvoltage (more than 1V) between the source and the drain terminals of the driving transistors 311 and 331, and the cascode transistors 312 and 332.

Figure 2:
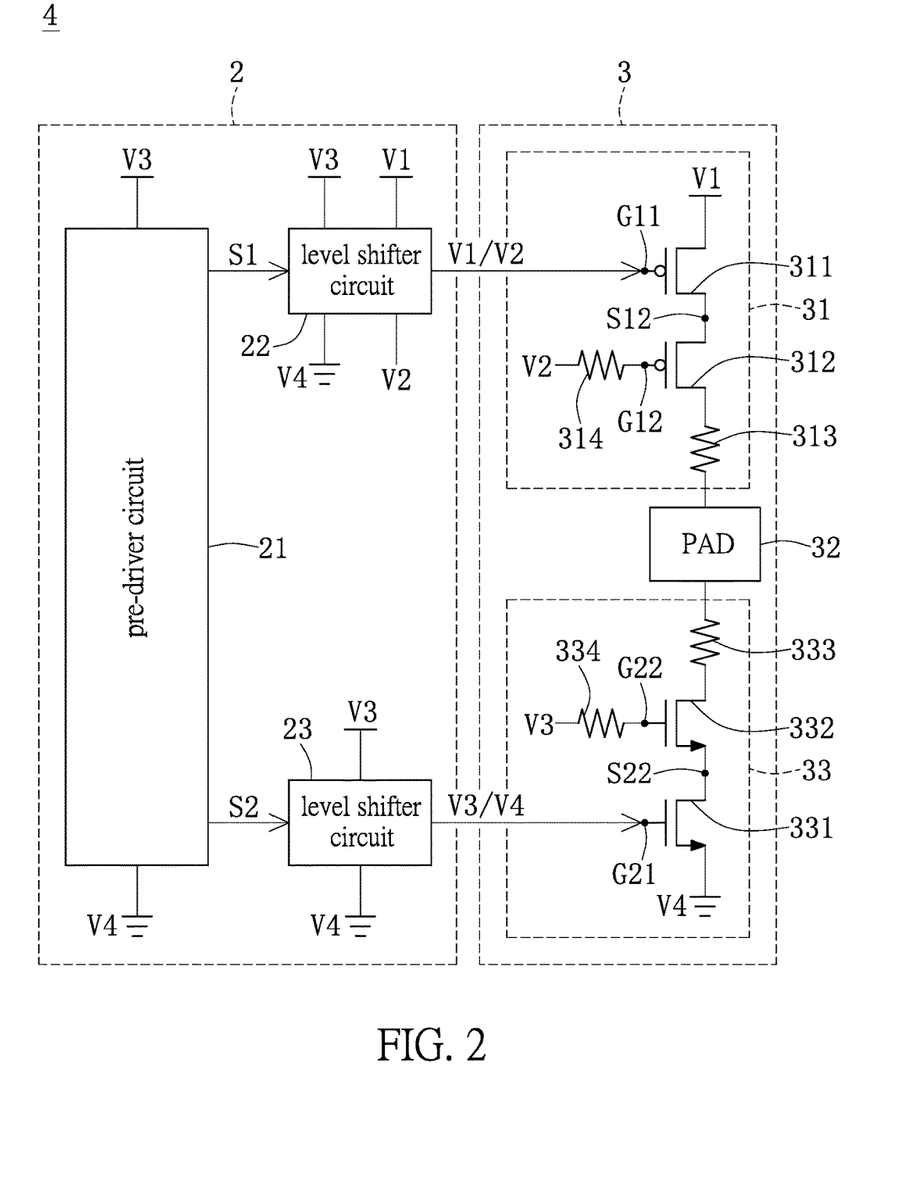
FIG. 2 shows a diagram of a memory depicted in accordance with an embodiment of the instant disclosure.

FIG. 2 shows a diagram of a memory 4 depicted in accordance with an embodiment of the instant disclosure. Differences between the memory 4 of FIG. 2 and the memory 1 of FIG. 1 are that the pull-up circuit 31 further includes a gate resistor 314, and that the pull-down circuit 33 further includes a gate resistor 334. A first end of the gate resistor 314 connects to the gate terminal G12 of the cascode transistor 312, and a second end of the gate resistor 314 receives the voltage V2. A first end of the gate resistor 334 connects to the gate terminal G22 of the cascode transistor 332, and a second end of the gate resistor 334 receives the voltage V3.

Figure 3:
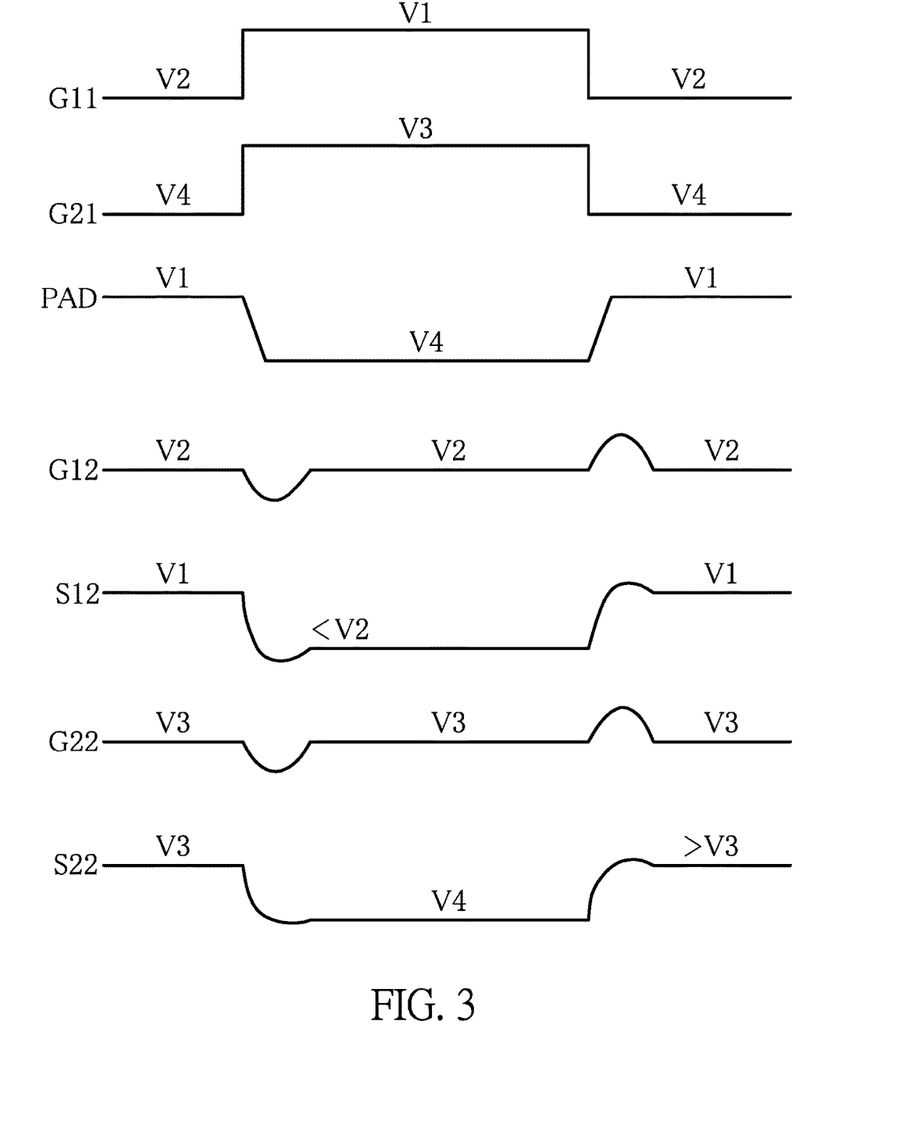
FIG. 3 shows a signal timing diagram of the memory in FIG. 2.

Reference is also made to FIG. 3. FIG. 3 shows a signal timing diagram of the memory 4 in FIG. 2. In this embodiment, when a voltage of the pad 32 rises from the voltage V4 to the voltage V1, the gate terminal G11 of the driving transistor 311 receives the voltage V2 and the gate terminal G21 of the driving transistor 331 receives the voltage V4. A voltage of the pad 32 is coupled to the gate terminal G12 of the cascode transistor 312 through a capacitor between the drain terminal and the gate terminal G12 of the cascode transistor 312. Then, a voltage of the gate terminal G12 of the cascode transistor 312 rises and is larger than the voltage V2, and a voltage of the source terminal S12 of the cascode transistor 312 rises so that an equivalent resistor of the pull-up circuit 31 is increased to extend a time length of the voltage of the pad 32 rising from the voltage V4 to the voltage V1, thereby decreasing a rising slew rate and reducing a voltage jitter of the voltage V1. It should be noted that the voltage of the pad 32 is coupled to the gate terminal G22 of the cascode transistor 332 through a capacitor between the drain terminal and the gate terminal G22 of the cascode transistor 332. A voltage of the gate terminal G22 of the cascode transistor 332 is larger than the voltage V3. Then, a voltage of the source terminal S22 of the cascode transistor 332 rises so that a voltage between the source and the drain terminals of the driving transistor 331 is larger than the voltage V3.

In this embodiment, when a voltage of the pad 32 falls from the voltage V1 to the voltage V4, the gate terminal G11 of the driving transistor 311 receives the voltage V1, and the gate terminal G21 of the driving transistor 331 receives the voltage V3. A voltage of the pad 32 is coupled to the gate terminal G22 of the cascode transistor 332 through a capacitor between the drain terminal and the gate terminal G22 of the cascode transistor 332. Then, a voltage of the gate terminal G22 of the cascode transistor 312 falls and is smaller than the voltage V3, and a voltage of the source terminal S22 of the cascode transistor 332 falls so that an equivalent resistance of the pull-down circuit 33 is increased to extend a time length of the voltage of the pad 32 falling from the voltage V1 to the voltage V4, thereby decreasing a falling slew rate and reducing a voltage jitter of the voltage V4. It should be noted that the voltage of the pad 32 is coupled to the gate terminal G12 of the cascode transistor 312 through a capacitor between the drain terminal and the gate terminal G12 of the cascode transistor 312. A voltage of the gate terminal G12 of the cascode transistor 312 is smaller than the voltage V2. Then, a voltage of the source terminal S12 of the cascode transistor 312 falls so that a voltage between the source and the drain terminals of the driving transistor 311 is larger than the voltage V3.

With this embodiment, the instant disclosure can decrease the rising slew rate of the pull-up circuit 31 and the falling slew rate of the pull-down circuit 33 of the output driving circuit 3 and thereby effectively reduce a voltage jitter, but cannot ensure that there is no overvoltage between the source and the drain of the driving transistors 311 and 331, and the cascode transistors 312 and 332.

Figure 4:
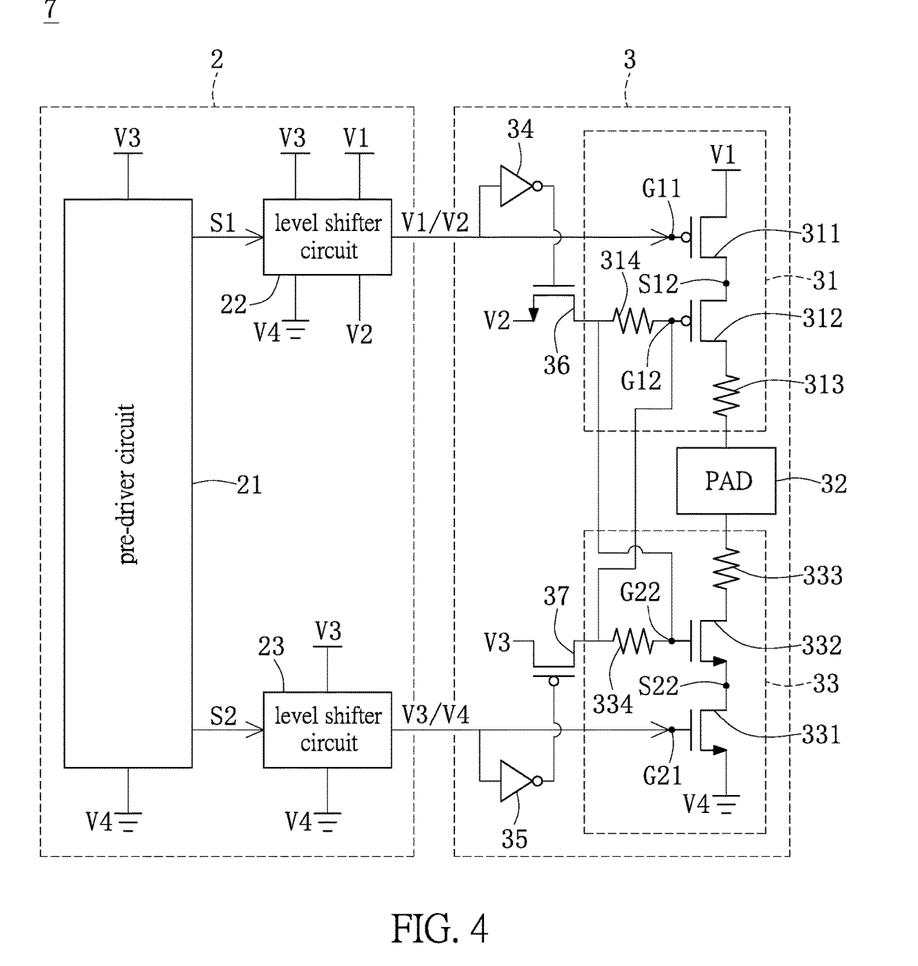
FIG. 4 shows a diagram of a memory depicted in accordance with an embodiment of the instant disclosure.

FIG. 4 shows a diagram of a memory 7 depicted in accordance with an embodiment of the instant disclosure. Differences between the memory 7 of FIG. 4 and the memory 4 of FIG. 2 are that the output driving circuit further includes: inverters 34 and 35, and switch transistors 36 and 37. An input end of the inverter 34 connects to the gate terminal G11 of the driving transistor 311. An input end of the inverter 35 connects to the gate terminal G21 of the driving transistor 331. A drain terminal of the switch transistor 36 connects to the second end of the gate resistor 314 and the gate terminal G22 of the cascode transistor 332. A gate terminal of the switch transistor 36 connects to an output end of the inverter 34. A source terminal of the switch transistor 36 receives the voltage V2. A source terminal of the switch transistor 37 receives the voltage V3. A gate terminal of the switch transistor 37 connects to an output end of the inverter 35. A drain terminal of the switch transistor 37 connects to the gate terminal of the cascode transistor 312 and the second end of the gate resistor 334.

Figure 5:
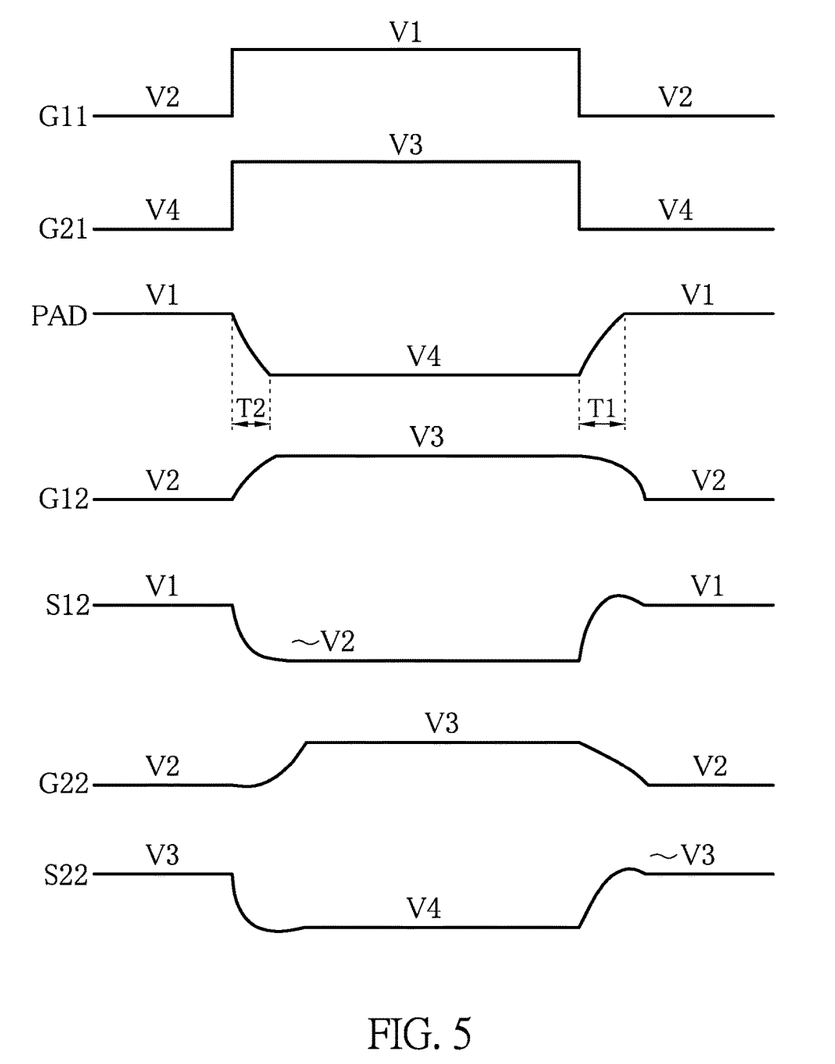
FIG. 5 shows a signal timing diagram of the memory in FIG. 4.

Reference is made to FIG. 5. FIG. 5 shows a signal timing diagram of the memory 7 in FIG. 4. In this embodiment, when a voltage of the pad 32 rises from the voltage V4 to the voltage V1, the gate terminal G11 of the driving transistor 311 receives the voltage V2, and the gate terminal G21 of the driving transistor 331 receives the voltage V4. A voltage of the pad 32 is coupled to the gate terminal G12 of the cascode transistor 312 through a capacitor between the drain terminal and the gate terminal G12 of the cascode transistor 312. Then, a voltage of the gate terminal G12 of the cascode transistor 312 rises and is larger than the voltage V2, and a voltage of the source terminal S12 of the cascode transistor 312 rises so that an equivalent resistance of the pull-up circuit 31 is increased to extend a time length of the voltage of the pad 32 rising from the voltage V4 to the voltage V1, thereby decreasing a rising slew rate and reducing a voltage jitter of the voltage V1. As a voltage of the drain terminal of the cascode transistor 332 rises, the source terminal S22 of the cascode transistor 332 is not affected by a rising voltage of the drain of the cascode transistor 332 since the gate terminal G22 of the cascode transistor 332 receives the voltage V2 (fixed voltage). A voltage of the source terminal S22 of the cascode transistor 332 does not rise over the voltage V3 so that a voltage between the drain and the source terminals of the driving transistor 331 is between the voltage V3 and the voltage V4.

In this embodiment, when a voltage of the pad 32 falls from the voltage V1 to the voltage V4, the gate terminal G11 of the driving transistor 311 receives V1 and the gate terminal G21 of the driving transistor 331 receives the voltage V3. A voltage of the pad 32 is coupled to the gate terminal G22 of the cascode transistor 332 through a capacitor between the drain terminal and the gate terminal G22 of the cascode transistor 332. Then, a voltage of the gate terminal G22 of the cascode transistor 312 falls and is smaller than the voltage V3, and a voltage of the source terminal S22 of the cascode transistor 332 falls so that a equivalent resistance of the pull-down circuit 33 is increased to extend a time length of the voltage of the pad 32 falling from the voltage V1 to the voltage V4, thereby decreasing a falling slew rate and reducing a voltage jitter of the voltage V4. As a voltage of the drain of the cascode transistor 332 falls, the source terminal S12 of the cascode transistor 312 is not affected by a falling voltage of the drain of the cascode transistor 312 since the gate terminal G12 of the cascode transistor 312 receives the voltage V3 (fixed voltage). A voltage of the source terminal S12 of the cascode transistor 312 does not fall under the voltage V2 so that a voltage between the drain and the source terminals of the driving transistor 331 is between the voltage V1 and the voltage V2.

With this embodiment, the instant disclosure can decrease the rising slew rate of the pull-up circuit 31 and the falling slew rate of the pull-down circuit 33 of the output driving circuit 3 and thereby effectively reduce a voltage jitter, and can ensure that there is no overvoltage between the source and the drain terminals of the driving transistors 311 and 331, and the cascode transistors 312 and 332.

Figure 6:
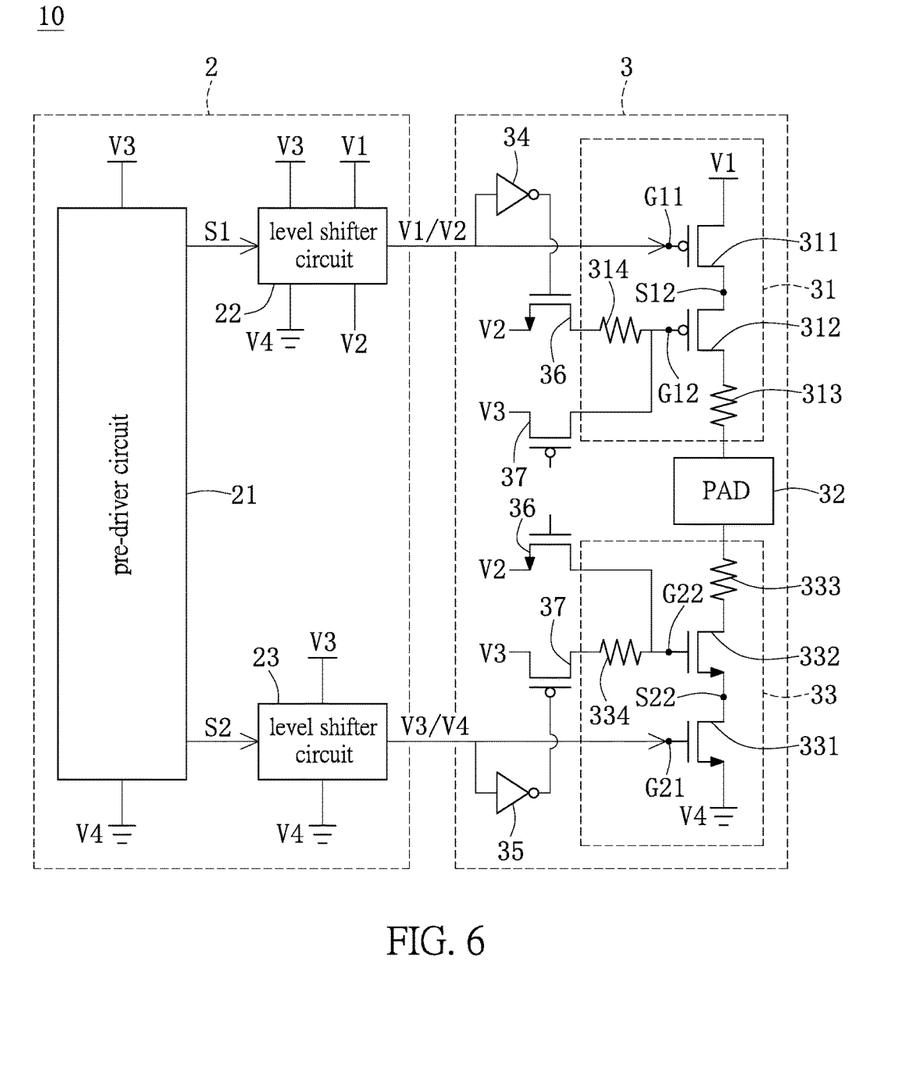
FIG. 6 shows a diagram of a memory depicted in accordance with an embodiment of the instant disclosure.

[R]eference is made to FIG. 6. FIG. 6 shows a diagram of a memory depicted in accordance with an embodiment of the instant disclosure. Differences between the memory 10 of FIG. 6 and the memory 7 of FIG. 4 are that the output driving circuit 3 includes two switch transistors 36 and two switch transistors 37. The two switch transistors 36 connect between the second end of the gate resistor 314 and the voltage V2 and between the gate terminal G22 of the cascode transistor 332 and the voltage V2, respectively. The two switch transistors 37 connect between the gate terminal G12 of the cascode transistor 312 and the voltage V3, and between the second end of the gate resistor 334 and the voltage V3. The memory 10 in FIG. 6 has similar timing diagram as shown in FIG. 5 and an effect thereof is the same as that of the memory in FIG. 4, and hence will not be reiterated herein.

Further, the driving transistor 311, the cascode transistor 312 and the switch transistor 37 of the instant disclosure are P-type Metal-Oxide-Semiconductor Field-Effect Transistors (PMOSFET). The driving transistor 331, the cascode transistor 333 and the switch transistor 33 are N-type Metal-Oxide-Semiconductor Field-Effect Transistors (NMOSFET). However, the instant disclosure is not limited thereto. Those skilled in the art can select PMOSFET and NMOSFET according to the circuit design.

In the above-mentioned embodiments, the memory can be a double data rate synchronous dynamic random access memory, but the instant disclosure is not limited thereto.

In summary, the double data rate synchronous dynamic random access memory and the output driving circuit thereof of the instant disclosure can ensure that the transistor within the output driving circuit will not have overvoltage problems and can work safely, but also meet the needs of high-speed access and be compatible with DDR3, DDR3L, DDR4, LPDDR4 and the higher-speed DDR.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A double data rate synchronous dynamic random access memory, comprising:
   a control circuit for providing a first voltage, a second voltage, a third voltage and a fourth voltage; and
   an output driving circuit coupled to the control circuit, the output driving circuit including:
      a pull-up circuit including:
         a first driving transistor, a source terminal of the first driving transistor receiving the first voltage, a gate terminal of the first driving transistor receiving the first voltage or the second voltage;
         a first cascode transistor, a source terminal of the first cascode transistor being connected to a drain terminal of the first driving transistor, a gate of the first cascode transistor receiving the second voltage; and a first resistor, a first end of the first resistor being connected to a drain terminal of the first cascode transistor;

a pad connected to a second end of the first resistor; and a pull-down circuit including:

a second resistor, a first end of the second resistor being connected to the pad;

a second cascode transistor, a drain terminal of the second cascode transistor being connected to a second end of the second resistor, a gate terminal of the second cascode transistor receiving the third voltage; and a second driving transistor, a drain terminal of the second driving transistor being connected to a source terminal of the second cascode transistor, a gate terminal of the second driving transistor receiving the third voltage or the fourth voltage, a source terminal of the second driving transistor receiving the fourth voltage;

wherein the second voltage is between the third voltage and the fourth voltage, and the third voltage is smaller than the first voltage.

2. The memory according to claim 1, wherein the second voltage is equal to a result of subtracting a voltage value of the third voltage from a voltage value of the first voltage.

3. The memory according to claim 1, wherein when a voltage of the pad rises from the fourth voltage to the first voltage, the gate terminal of the first driving transistor receives the second voltage, the gate terminal of the second driving transistor receives the fourth voltage, and a voltage between the drain and the source terminals of the second driving transistor is between the third voltage and the fourth voltage.

4. The memory according to claim 1, wherein when a voltage of the pad falls from the first voltage to the fourth voltage, the gate terminal of the first driving transistor receives the first voltage, the gate terminal of the second driving transistor receives the third voltage, and a voltage between the drain and the source terminals of the first driving transistor is between the first voltage and the second voltage.

5. The memory according to claim 1, wherein the pull-up circuit further includes:

a first gate resistor, a first end of the first gate resistor being connected to the gate terminal of the first cascode transistor, a second end of the first gate resistor receiving the second voltage; and wherein the pull-down circuit further includes:

a second gate resistor, a first end of the second gate resistor being connected to the gate terminal of the second cascode transistor, a second end of the second gate resistor receiving the third voltage.

6. The memory according to claim 5, wherein when a voltage of the pad rises from the fourth voltage to the first voltage, the gate terminal of the first driving transistor receives the second voltage, and the gate terminal of the second driving transistor receives the fourth voltage.

7. The memory according to claim 5, wherein when a voltage of the pad falls from the first voltage to the fourth voltage, the gate terminal of the first driving transistor receives the first voltage, and the gate terminal of the second driving transistor receives the third voltage.

8. The memory according to claim 5, wherein the output driving circuit further includes:

a first inverter, an input end of the first inverter being connected to the gate terminal of the first driving transistor;

a second inverter, an input end of the second inverter being connected to the gate terminal of the second driving transistor;

a first switch transistor, a drain terminal of the first switch transistor being connected to the second end of the first gate resistor and the gate terminal of the second cascode transistor, a gate terminal of the first switch transistor being connected to an output end of the first inverter, a source terminal of the first switch transistor receiving the second voltage; and a second switch transistor, a source terminal of the second switch transistor receiving the third voltage, a gate terminal of the second switch transistor being connected to an output end of the second inverter, a drain terminal of the second switch transistor being connected to the gate terminal of the first cascode transistor and the second end of the second gate resistor.

9. The memory according to claim 8, wherein when a voltage of the pad rises from the fourth voltage to the first voltage, the gate terminal of the first driving transistor receives the second voltage, and the gate terminal of the second driving transistor receives the fourth voltage, and the gate terminal of the second cascode transistor receives the second voltage.

10. The memory according to claim 8, wherein when a voltage of the pad falls from the first voltage to the fourth voltage, the gate terminal of the first driving transistor receives the first voltage, the gate terminal of the second driving transistor receives the third voltage, and the gate terminal of the first cascode transistor receives the third voltage.

11. An output driving circuit, comprising:

a pull-up circuit including:

a first driving transistor, a source terminal of the first driving transistor receives a first voltage, a gate terminal of the first driving transistor receiving the first voltage or a second voltage;

a first cascode transistor, a source terminal of the first cascode transistor being connected to a drain terminal of the first driving transistor, a gate terminal of the first cascode transistor receiving the second voltage; and a first resistor, a first end of the first resistor being connected to a drain terminal of the first cascode transistor;

a pad connected to a second end of the first resistor; and a pull-down circuit including:

a second resistor, a first end of the second resistor being connected to the pad;

a second cascode transistor, a drain terminal of the second cascode transistor being connected to a second end of the second resistor, a gate terminal of the second cascode transistor receiving a third voltage; and a second driving transistor, a drain terminal of the second driving transistor being connected to a source of the second cascode transistor, a gate terminal of the second driving transistor receiving the third voltage or a fourth voltage, a source terminal of the second driving transistor receiving the fourth voltage;

wherein the second voltage is between the third voltage and the fourth voltage, and the third voltage is smaller than the first voltage.

12. The circuit according to claim 11, wherein the second voltage is equal to a result of subtracting a voltage value of the third voltage from a voltage value of the first voltage.

13. The circuit according to claim 11, wherein when a voltage of the pad rises from the fourth voltage to the first voltage, the gate terminal of the first driving transistor receives the second voltage, the gate of the second driving transistor receives the fourth voltage, and a voltage between the drain and the source terminals of the second driving transistor is between the third voltage and the fourth voltage.

14. The circuit according to claim 11, wherein when a voltage of the pad falls from the first voltage to the fourth voltage, the gate terminal of the first driving transistor receives the first voltage, the gate terminal of the second driving transistor receives the third voltage, and a voltage between the drain and the source terminals of the first driving transistor is between the first voltage and the second voltage.

15. The circuit according to claim 11, wherein the pull-up circuit further includes:
a first gate resistor, a first end of the first gate resistor being connected to the gate terminal of the first cascode transistor, a second end of the first gate resistor receiving the second voltage; and
wherein the pull-down circuit further includes:
a second gate resistor, a first end of the second gate resistor being connected to the gate terminal of the second cascode transistor, a second end of the second gate resistor receiving the third voltage.

16. The circuit according to claim 15, wherein when a voltage of the pad rises from the fourth voltage to the first voltage, the gate terminal of the first driving transistor connects to the second voltage, and the gate terminal of the second driving transistor receives the fourth voltage.

17. The circuit according to claim 15, wherein when a voltage terminal of the pad falls from the first voltage to the fourth voltage, the gate terminal of the first driving transistor receives the first voltage, and the gate terminal of the second driving transistor receives the third voltage.

18. The circuit according to claim 15 further comprising:
a first inverter, an input end of the first inverter being connected to the gate terminal of the first driving transistor;
a second inverter, an input end of the second inverter being connected to the gate terminal of the second driving transistor;
a first switch transistor, a drain terminal of the first switch transistor being connected to the second end of the first gate resistor and the gate terminal of the second cascode transistor, a gate terminal of the first switch transistor being connected to an output end of the first inverter, a source terminal of the first switch transistor receiving the second voltage; and
a second switch transistor, a source terminal of the second switch transistor receiving the third voltage, a gate terminal of the second switch transistor being connected to an output end of the second inverter, a drain terminal of the second switch transistor being connected to the gate terminal of the first cascode transistor and the second end of the second gate resistor.

19. The circuit according to claim 18, wherein when a voltage of the pad rises from the fourth voltage to the first voltage, the gate terminal of the first driving transistor connects to the second voltage, the gate terminal of the second driving transistor connects to the fourth voltage, and the gate of the second cascode transistor receives the second voltage.

20. The circuit according to claim 18, wherein when a voltage of the pad falls from the first voltage to the fourth voltage, the gate terminal of the first driving transistor receives the first voltage, the gate of the second driving transistor receives the third voltage, and the gate of the first cascode transistor connects to the third voltage so that a voltage between the drain and the source terminals of the first driving transistor is between the third voltage and the fourth voltage.

* * * * *